United States Patent
Sun et al.

(10) Patent No.: US 8,492,189 B2
(45) Date of Patent: *Jul. 23, 2013

(54) COMBINATORIAL SCREENING OF TRANSPARENT CONDUCTIVE OXIDE MATERIALS FOR SOLAR APPLICATIONS

(75) Inventors: Zhi-Wen Sun, Sunnyvale, CA (US); Nitin Kumar, Fremont, CA (US); Guizhen Zhang, Santa Clara, CA (US); Nikhil Kalyankar, Hayward, CA (US); Minh Anh Nguyen, San Jose, CA (US)

(73) Assignee: Intermolecular, Inc., San Jose, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 13/460,333

(22) Filed: Apr. 30, 2012

(65) Prior Publication Data

US 2012/0238050 A1 Sep. 20, 2012

Related U.S. Application Data

(63) Continuation of application No. 12/791,726, filed on Jun. 1, 2010, now Pat. No. 8,263,427.

(51) Int. Cl.
*H01L 21/00* (2006.01)

(52) U.S. Cl.
USPC .................................. 438/57; 257/E21.012

(58) Field of Classification Search
USPC .................. 438/71, 57; 257/E31.13, E21.012
See application file for complete search history.

(56) References Cited

U.S. PATENT DOCUMENTS

| | | | |
|---|---|---|---|
| 7,544,574 B2* | 6/2009 | Chiang et al. | 438/297 |
| 7,745,345 B2* | 6/2010 | Horio et al. | 438/745 |
| 8,263,427 B2* | 9/2012 | Sun et al. | 438/57 |
| 2007/0082485 A1* | 4/2007 | Chiang et al. | 438/665 |
| 2008/0210660 A1* | 9/2008 | Stockum et al. | 216/13 |
| 2009/0152511 A1* | 6/2009 | Koo et al. | 252/520.1 |
| 2009/0194767 A1* | 8/2009 | Miura et al. | 257/43 |
| 2010/0117070 A1* | 5/2010 | Adekore et al. | 257/43 |

* cited by examiner

*Primary Examiner* — William D Coleman
*Assistant Examiner* — Christine Enad

(57) ABSTRACT

Embodiments of the current invention include methods of improving a process of forming a textured TCO film by combinatorial methods. The combinatorial method may include depositing a TCO by physical vapor deposition or sputtering, annealing the TCO, and etching the TCO where at least one of the depositing, the annealing, or the etching is performed combinatorially. Embodiments of the current invention also include improved methods of forming the TCO based on the results of combinatorial testing.

20 Claims, 6 Drawing Sheets

COMBINATORIAL SCREENING OF TRANSPARENT CONDUCTIVE OXIDE MATERIALS FOR SOLAR APPLICATIONS

CROSS-REFERENCE TO RELATED APPLICATION

This application is a Continuation Application and claims priority to U.S. application Ser. No. 12/791,726 filed on Jun. 1, 2010, which is herein incorporated by reference for all purposes.

FIELD OF THE INVENTION

The present invention relates generally to thin film photovoltaic solar cell processing. More specifically, a method of depositing a transparent conductive oxide (TCO) and a method of improving the TCO film qualities by combinatorial methods are described.

BACKGROUND OF THE INVENTION

Currently, the starting substrates and superstrates in many thin film photovoltaic (TFPV) solar cells are made of planar low iron (Fe) float glass on which a transparent conducting oxide (TCO) film is deposited. The TCO film is used to electrically contact one terminal of the TFPV solar cell. Although the planar TCO coated glass does an adequate job in allowing light to enter the cell, it does a poor job in light trapping. One method being employed today to improve light trapping is to texture the TCO film itself. Many factors may influence the texture of the TCO film including the initial deposition of the TCO film. The uniformity and initial texture of the TCO film as deposited are two aspects that may affect the ultimate texture of the TCO film after further processing. To obtain uniform as-deposited TCO films the films are deposited at a high temperature of greater than 350° C. by physical vapor deposition (PVD). This process provides a uniform TCO film but the processing is difficult due to the need to heat a very large area for large solar substrates that may be on the scale of 2 meters by 3 meters. Maintaining a constant temperature over the entire substrate requires a complicated and expensive PVD tool. Additionally, a more complicated PVD tool has more parts that can wear out or break, therefore increasing the down-time of the tool. The cleaning of such a high temperature tool is also a frequent necessity and also adds to the down-time. Greater down-time of a tool and more parts needing replacement translates to increased cost. Solar manufacturing costs must be minimized to make the technology competitive in the modern energy market.

BRIEF DESCRIPTION OF THE DRAWINGS

Various embodiments of the invention are disclosed in the following detailed description and the accompanying drawings.

DETAILED DESCRIPTION

Figure 1:
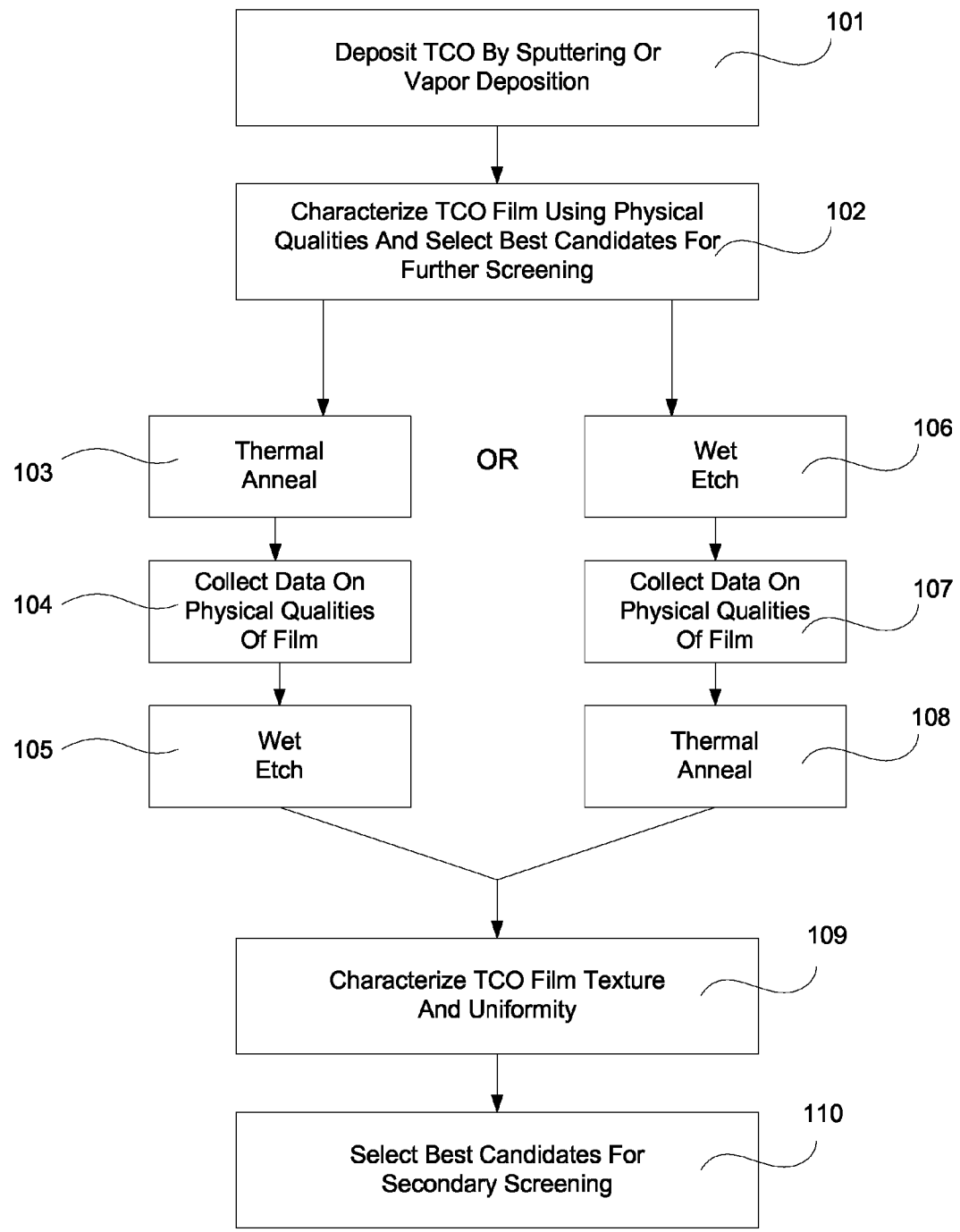
FIG. 1 is a flowchart showing a combinatorial primary screening process according to an embodiment of this invention.

A detailed description of one or more embodiments is provided below along with accompanying figures. The detailed description is provided in connection with such embodiments, but is not limited to any particular example. The scope is limited only by the claims and numerous alternatives, modifications, and equivalents are encompassed. Numerous specific details are set forth in the following description in order to provide a thorough understanding. These details are provided for the purpose of example and the described techniques may be practiced according to the claims without some or all of these specific details. For the purpose of clarity, technical material that is known in the technical fields related to the embodiments has not been described in detail to avoid unnecessarily obscuring the description.

Embodiments of the current invention include methods of improving a process of forming a textured TCO film by combinatorial methods. The combinatorial method may include depositing a TCO by physical vapor deposition or sputtering, annealing the TCO, and etching the TCO where at least one of the depositing, the annealing, or the etching is performed combinatorially. Embodiments of the current invention also include improved methods of forming the TCO based on the results of combinatorial testing.

An improved process of forming a textured TCO film may be developed using combinatorial methods. Combinatorial processing may include any processing that varies the processing conditions in two or more regions of a substrate. The combinatorial methodology, in embodiments of the current invention, includes multiple levels of screening to select the TCO films formed by different processes for further variation and improvement. In an embodiment, the process of forming a textured TCO is improved to provide a TCO having a texture that can trap light within a TFPV within a wide light spectrum and at a high efficiency (diffused transmission with no increase in absorption) but also provide a completed TFPV of high efficiency. Additionally, the process of forming the TCO may be improved to reduce the cost of building a TFPV without sacrificing performance.

There maybe three levels of screening for the development of the TCO deposition and texturing processes using combinatorial methodologies. Primary screening incorporates and focuses on materials discovery. Here, the materials may be screened for certain properties in order to select possible candidates for a next level of screening. In the initial primary screening there may be thousands of candidates which are subsequently reduced to hundreds of candidates. These hundreds of candidates can then be used or advanced to secondary screening processes which will look at materials and unit processes development. In the secondary screening level, process integration may be additionally considered to narrow the candidates from hundreds of candidates to tens of candidates. Thereafter, tertiary screening further narrows these candidates through process integration and device qualification in order to identify some best possible optimizations in terms of materials, unit processes and process sequence integration.

In one embodiment, the primary and secondary testing may occur on a coupon, while the tertiary testing is performed on a production size substrate. Through this multi-level screening process, the best possible candidates have been identified from many thousands of options. The time required to perform this type of screening will vary, however, the efficiencies gained through the HPC methods provide a much faster development system than any conventional technique or scheme. While these stages are defined as primary second and tertiary, these are arbitrary labels placed on these steps. Furthermore, primary screening is not necessarily limited to materials research and can be focused on unit processes or process sequences, but generally involves a simpler substrate, less steps and quicker testing than the later screening levels.

The stages also may overlap and there may be feedback from the secondary to the primary, and the tertiary to the secondary and/or the primary to further optimize the selection of materials, unit processes and process sequences. In this manner, the secondary screening begins while primary screening is still being completed, and/or while additional primary screening candidates are generated, and tertiary screening can begin once a reasonable set of options are identified from the secondary screening. Thus, the screening operations can be pipelined in one embodiment. As a general matter and as discussed elsewhere in more detail, the level of sophistication of the structures, process sequences, and testing increases with each level of screening. Furthermore, once the set of materials, unit processes and process sequences are identified through tertiary screening, they may be integrated into the overall manufacturing process and qualified for production, which can be viewed as quaternary screening or production qualification. In one more level of abstraction, a substrate can be pulled from the production process, combinatorially processed, and returned to the production process under tertiary and/or quaternary screening.

In one particular embodiment of the current invention, the screening at the different levels of the funnel is designed to improve the deposition and etching of a TCO to obtain an improved textured TCO. At the primary screening level of this embodiment, the TCO film is combinatorially screened in a high throughput manner to determine whether the TCO film has the physical characteristics in terms of uniformity, texture shape, and texture size to be a potential candidate. The compatibility of the processes used with the substrates and films is also determined. The TCO films having the best physical characteristics and compatibility are then screened at the secondary screening level. The secondary screening tests the optical qualities of the film. The TCO films with the best optical qualities are then selected for tertiary screening at level. At the tertiary screening level a select number of TCO films having improved physical and optical qualities are integrated into a solar cell in order to test the electrical performance of those solar cells. The best performing solar cells from the tertiary screening level 130 may then be selected to be scaled up to production of commercial solar cells.

FIG. 1 illustrates a more detailed flow chart of the primary screening. The TCO film at the primary screening level is varied combinatorially during the deposition of the TCO film, the annealing of the TCO film, or the etching of the TCO film. The combinatorial varying may also be done during more than one of these processes. In other embodiments, the order of these unit processes may be varied. As will be described in relation to FIG. 1, the order of the annealing and the etching may be changed to combinatorially determine the effects of performing the anneal either before or after the etching of the TCO film. At the primary screening level the TCO film is combinatorially screened based on physical characteristics collected throughout the deposition, annealing, and texturing process. At block 101 of FIG. 1 a TCO film is deposited. In one embodiment, the TCO may be zinc oxide (ZnO) doped with different dopants (B, Al, Ga, In). Doped ZnO is the one candidate for the TCO front contact window due to its high optical transmittance, high electrical conductivity, and high resistance to H-plasma that is needed for the silicon layer deposition following TCO deposition and texturing. In alternative embodiments the TCO may be other materials such as Indium doped Tin Oxide (ITO), Flourine doped tin oxide (FTO), and Aluminum doped Zinc Oxide (AZO.) The TCO film may be deposited by sputtering or by physical vapor deposition (PVD). In embodiments where the TCO film is not varied combinatorially, the deposition may be a blanket deposition. The thickness of the TCO layer may be in the approximate range of 0.5 um and 2.0 um, but may be deposited to any thickness sufficient to provide enough TCO material for the texture etch process. The TCO film is etched as part of the texturing process, a portion of the as-deposited TCO 415 will be sacrificial.

Site-isolated regions of TCO films may be deposited in an embodiment where the deposition of the TCO film is varied combinatorially. Within a site-isolated region the process conditions are substantially uniform. It should be appreciated that a region may be adjacent to another region in one embodiment or the regions may be isolated and, therefore, non-overlapping. When the regions are adjacent, there may be a slight overlap wherein the materials or precise process interactions are not known, however, a portion of the regions, normally at least 50% or more of the area, is uniform and all testing occurs within that region. Further, the potential overlap is only allowed with material of processes that will not adversely affect the result of the tests. Both types of regions are referred to herein as site-isolated regions or discrete regions.

The site-isolated regions may be defined by placing a physical mask on the substrate and depositing the TCO over the physical mask. In one embodiment, the varying of the TCO film may be done by varying the deposition temperature of the substrate between one site-isolated region and another. Other deposition parameters may also be varied, either individually or in combination, such as time, pressure, and gas ambient within the chamber. For example, the gas ambient may be varied between oxygen, nitrogen, or inert gases such as argon. In another embodiment, the TCO film may be varied by varying the material itself, such as varying the material composition, material ratio, dopant levels, or dopant types.

At block 102 of the flowchart in FIG. 1, the TCO film is characterized using physical qualities. The physical qualities measured may include thickness, composition, crystallinity, crystal grain size, crystal grain size distribution, crystal strain on the film, surface roughness, and the size shape and distribution of the texture features. These physical qualities may be measured to compare the characteristics of the TCO film between varied site-isolated regions or to compare the TCO film as-deposited to the TCO after annealing and/or etching. Examples of metrology tools or methods that may be used to obtain the physical measurements include atomic force microscopy (AFM), XRD, XRF, spectroscopic ellipsometry, fourier transform infra-red (FTIR) spectroscopy, or sheet resistance. Based on the characterization of the TCO film by its physical qualities the best candidates are selected for further screening at the primary screening level. In an embodiment, the screening of the best candidates is conducted, for example, by determining which of the TCO films uniformly cover the substrate, have a thickness that can stand up to subsequent etching, and/or have a texture with features of a particular size and shape. The specifics of these criteria depend on the desired parameters of an improved TCO textured film.

The candidates selected after characterization of the as-deposited TCO film are then annealed and etched. The order of the anneal and the etch may be varied to determine the effects of the order of these unit processes on the TCO film and the glass substrate. In one embodiment, shown by blocks 103, 104, and 105 of FIG. 1, the annealing is performed before the etching of the TCO film. The anneal at block 103 is a thermal anneal. The temperature of the thermal anneal and the conditions under which it is performed may be varied. The temperature may be varied within a range of approximately 250° C. and 650° C. The anneal may be performed combinatorially by varying the temperature between site isolated regions of the substrate. Temperature may be varied between site isolated regions by individual heating units within the pedestal or by a laser that can be directed at the different site isolated regions on the substrate. Conditions that may be varied within the annealing chamber include pressure and the gas ambient within the chamber. For example, the amount of oxygen within the chamber may be varied to determine the effect of performing the thermal anneal in an oxygen environment of varied oxygen concentrations. The annealing of the TCO film may alter the texture of the as-deposited TCO film. In some embodiments the annealing may increase the uniformity of the TCO film as well as affecting the texture. At block 104 data on the physical qualities of the film after the thermal anneal are collected. This data may be used to characterize the TCO at this point in the processing or for comparison to later data or to the earlier data.

At block 105 of this embodiment a wet etch is performed to texture the TCO film. The texturing may modify an already existing texture of the as-deposited film. The as-deposited TCO films that make it through the first screening after the deposition step have been selected for their uniformity and texture. In some embodiments the texture of the TCO film is created during the wet etching using various techniques such as molecular masking or through the selection of etching agents. Molecular masking is a technique where components within the etching formulation interact with the surface of the TCO in such a way as to create a sort of "molecular mask" that allows for differential texturing between different portions of the TCO film. Components within the etching formulation that may serve as the molecular mask vary widely, but in some embodiments may be a passivation surface modifier such as a silane based material dissolved into an organic solvent in various concentrations. Without being bound by theory, it is speculated that the passivation surface modifier forms islands on the surface of the TCO that serve as an etchant mask during the subsequent wet etching process as will be described below. This masking can be used to control the pattern of the texture formed on the surface of the TCO. The molecular masking may be part of a pre-treatment before the wet etch. Alternatively, the molecular masking component may be added as part of the etching formulation.

The etching may be performed combinatorially by varying the composition of the etching formulation using varied etchants or combination of etchants, varied solvents or combination of solvents, varied surface modifiers, or the variation of any other additive that may serve some purpose as part of the formulation, such as surfactants. Also, the formulation may have varied concentrations of the components. Conditions of the wet etch may also be varied, such as the temperature for the wet etch process, the time duration for the texture etch, or the solution agitation by, for example, stirring at varying rpm. The variation of the wet etch between site-isolated regions of the substrate may be performed using a combinatorial tool configured for wet processing operation that may be used to perform the screening processes in accordance with one embodiment of the invention. The site isolated regions may be formed by the tool using sealing systems for isolating reactions in individual reactors that are in close proximity to other reactors. The individual reactors may be sleeves having a sealing edge that comes into contact with the substrate.

The etching formulation may include an acid as the etchant, such as an inorganic or organic acid in either an aqueous or non-aqueous solvent. Examples of acids include sulfuric acid, hydrochloric acid, nitric acid, and phosphoric acid or any mixtures of these acids. In one embodiment, the surface texturing may be performed by a texturing formulation that is an aqueous solution of an organic acid. In one particular embodiment, the organic acid is selected from the hydroxyl carboxylic acid family which includes carboxylic acids possessing 1-3 hydroxyl groups, such as glycolic acid, lactic acid, malonic acid, succinic acid, adipic acid, malic acid, tartaric acid, and citric acid. In particular embodiments, the acids selected from this family of hydroxyl carboxylic acids for TCO texturing are glycolic acid and citric acid. In alternative embodiments, the etching formulation may include combinations of organic acids and inorganic acids. The active etchant component may also be selected from a basic compound such as KOH or NaOH. Similar to the acidic etching formulations the basic etching formulations may be varied using different bases or combinations of bases.

In an alternative embodiment described in blocks 106, 107, and 108 the wet etch is performed before the thermal anneal. In this embodiment the effect of the varying of the order of the wet etching and the annealing can be determined when compared to the embodiment described in blocks 103, 104, and 105 where the thermal anneal is performed before the wet etch. At block 106 the as-deposited TCO film is wet etched using any of the wet etch formulations described above and in any of the potential variations. The wet etch 106 may be performed combinatorially or globally across the substrate. Data on the physical qualities of the TCO film may be collected at block 107 for comparison to the earlier characterization of the TCO film after deposition to determine the effects of the wet etch on the texture and uniformity. After performing the wet etch a thermal anneal is performed on the substrate to determine its effects on the TCO film. The thermal anneal may be performed combinatorially as described above by varying the temperature or the conditions of the annealing chamber. Alternatively, the anneal could be performed conventionally to be consistent over the entire substrate.

After performing both the anneal and the wet etch of the TCO film, where either the anneal or the wet etch are performed first, the TCO film may be characterized at block 109 to characterize the TCO film texture and uniformity. At block 109 the TCO film is characterized using physical qualities, as was described above at block 102. The physical qualities measured may include thickness, composition, crystallinity, crystal grain size, crystal grain size distribution, crystal strain on the film, surface roughness, and the size shape and distribution of the texture features. These physical qualities may be measured to compare the characteristics of the TCO film between varied site-isolated regions or to compare the TCO film as-deposited to the TCO after annealing and/or etching. Examples of metrology tools or methods that may be used to obtain the physical measurements include atomic force microscopy (AFM), XRD, XRF, spectroscopic ellipsometry, fourier transform infra-red (FTIR) spectroscopy, or sheet resistance. In addition to the characterization of the TCO film texture and uniformity, the compatibility of the processes used with the substrates and TCO films is also determined. If a process is not compatible with the substrate, then even if the texture of the TCO film has the features determined to have potential in the experimental design, those TCO films will not proceed to the secondary screening level. Compatibility issues include whether the glass substrate is etched during the wet etch or whether the glass substrate is broken or otherwise damaged during the anneal. Also, effects on the TCO film are studied to be sure that there is no significant change in resistivity and that there is no absorption of moisture which could change the composition. Additionally, the difference between the thickness of the TCO film before and after etching and/or annealing is measured. Films where the thickness is significantly reduced may not be ideal candidates to continue to the secondary screening level. Based on the characterization of the TCO film by its physical qualities the best textured TCO film candidates are selected for further screening at the secondary screening level as described at block 110 of the flowchart of FIG. 1.

Figure 2:
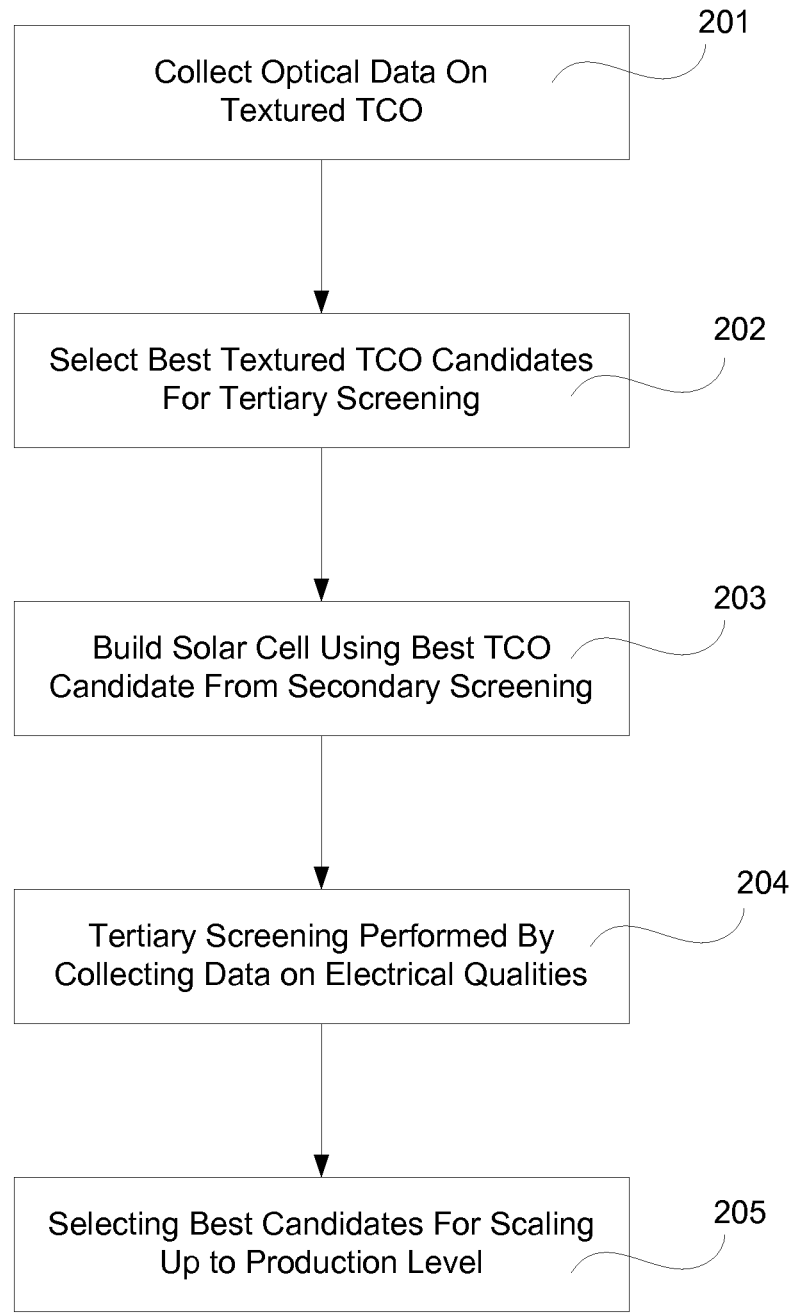
FIG. 2 is a flowchart showing the secondary and tertiary screening processes of a combinatorial method according to an embodiment of this invention.

FIG. 2 is a flowchart of the secondary and tertiary screening processes performed to determine the improved processing for a TCO film to obtain a TCO film having an improved texture. At the secondary screening level represented by block 201 the optical qualities of the TCO film are characterized by collecting optical data on the textured TCO film. The optical data collected includes diffused transmission, total transmission, reflectance, absorption coefficient, and refractive index. These data may be collected by spectroscopic ellipsometry (200 nm-1000 nm) and UV-Vis spectroscopy (300 nm-2500 nm). In an embodiment, the optical performance screening criteria include improved diffused transmission with no increase in absorption and high kurtosis. Both of these measurements provide an indication of how well the textured TCO film will scatter light. A higher kurtosis value indicates that the textured features are sharper and therefore are better able to scatter light. Kurtosis in combination with root means square (rms) calculations of the texture using thickness data can provide an understanding of the texture and how it correlates to the optical performance of the TCO film. Alternately, rms of the texture in combination with one or both of Kurtosis and skewness may provide an understanding of how the texture of the TCO film correlates to the optical performance of the TCO film. Kurtosis may also be a way to ultimately correlate the physical characteristics of the textured TCO film to the electrical performance of a thin film photovoltaic cell (TFPV) built with the textured TCO film. As such the electrical performance can be predicted based on the texturing, thus enabling the engineering of TCO films having improved characteristics.

Figure 4A:
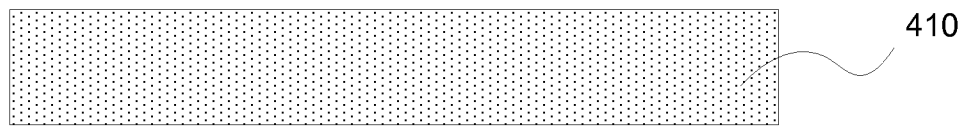
FIGS. 4A through 4E illustrate cross-sectional views of a process flow of a method of forming a solar cell according to one embodiment of the current invention.
Figure 4B:
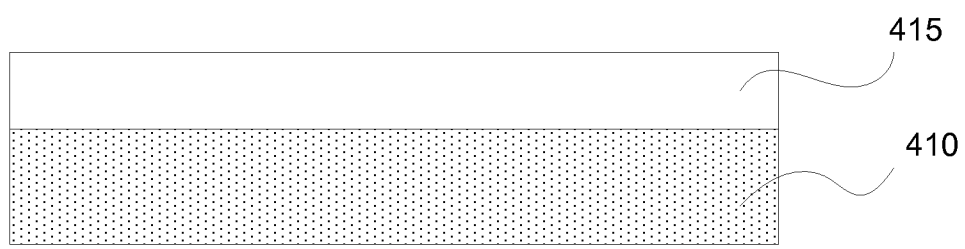
Figure 4C:
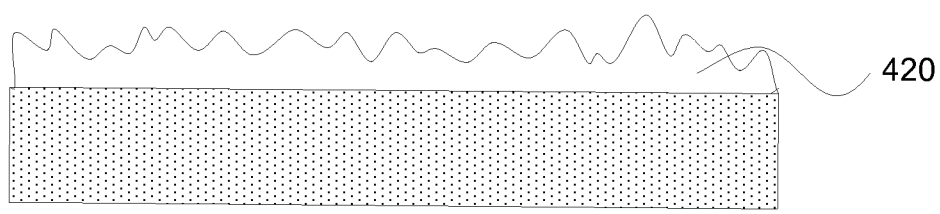

At block 202 the best textured TCO candidates are selected for tertiary screening. The selection criteria are determined in advance based on the design of the experiment. At block 203 the best TCO candidates from the secondary screening are used to build solar cells. The solar cells built integrating the textured TCO candidates are thin film photovoltaic cells (TFPV's). The FIGS. 4A-4E illustrate the process of forming a TFPV. At FIG. 4A, the TCO film is deposited onto a transparent substrate 410 of FIG. 4A, which in one particular embodiment may be float glass. One surface of the float glass may be doped with an element or compound to control the index of reflection of the glass. Dopants that may be used in the float glass include tin (Sn), F, B, and $Ti_xO_y$. FIG. 4B shows the as-deposited TCO film 415 on the transparent substrate 410. The TCO film deposited depends on which of the TCO film candidates are selected after the secondary screening to proceed to the tertiary screening. The type of deposition, either physical vapor deposition or sputter as well as the conditions of the deposition, including the deposition temperature, may be determined by the process used for the particular TCO film candidate being integrated into the TFPV. Additionally, the thickness may have been determined through experimentation or it may be any thickness sufficient to provide enough TCO material for the texture etch process. The as-deposited TCO film 415 may then be either annealed or textured depending on which order of these unit processes was determined to be improved for the processing. The annealing and etching conditions will be the same as those used to create the TCO film that was selected based on the predetermined criteria. The etching formulation used will also have been determined during the secondary screening process. FIG. 4C illustrates a textured TCO 420 after the annealing and wet etching processes.

Figure 4D:
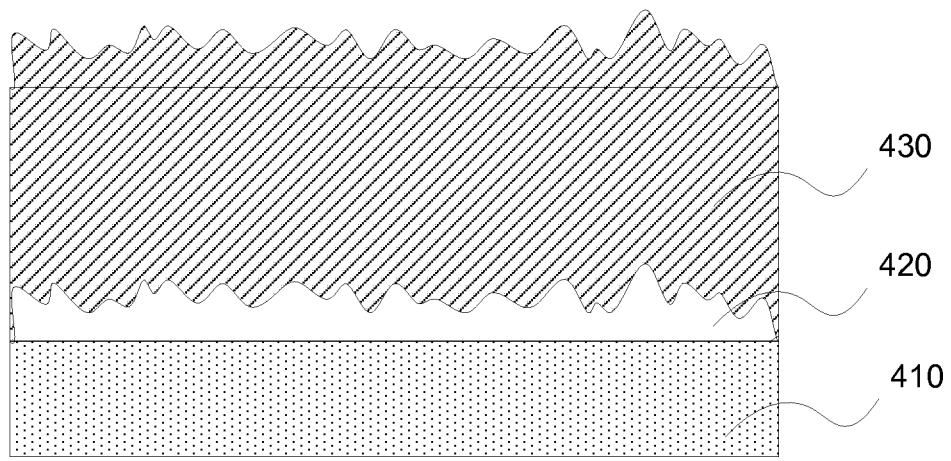
Figure 4E:
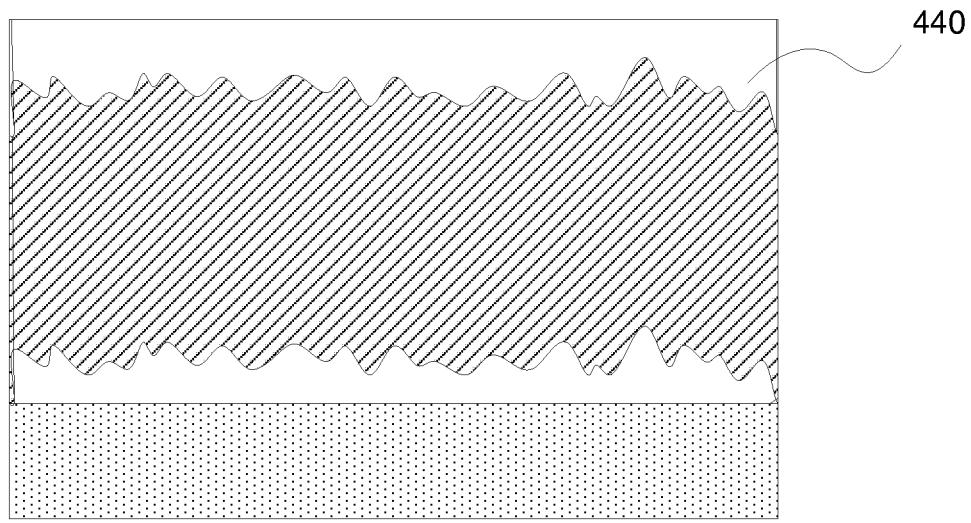

The formation of the silicon 430 and the deposition of the back-contact 440 may then be completed to form the TFPV. In FIG. 4D the silicon 430 is deposited to serve as the optical conversion layer where light is transformed into electrical energy. The silicon layer 430 may deposit conformally over the textured TCO film and thus the texturing will be translated to the silicon layer 430 as illustrated in FIG. 4D. A single layer of silicon 430 is shown for purposes of demonstration, but it is to be understood that the silicon layer 430 may be multiple layers or junctions of silicon of various types such as crystalline silicon, polycrystalline silicon, or amorphous silicon. In FIG. 4E, the deposition of a back contact electrode [440 completes the basic TFPV solar cell 400. The back contact electrode 440 may be any conductive material such as a metal or conductive polymer.

At block 204 of the flowchart in FIG. 2 the tertiary screening is performed by collecting data on the electrical qualities of the TFPV cells that were built using the best texture TCO candidates from the secondary screening. The primary criterion for the screening at the tertiary level is whether the TFPV solar cells provide improved efficiency. The electrical data collected includes current voltage (I-V) and external quantum efficiency (EQE) of the solar cells to be able to characterize their performance. At block 205 the best candidates at the tertiary screening level are then selected for scaling up to production level. The scaling up of the TFPV process to production scale on very large substrates will prove that the combinatorially improved textured TCO films and the TFPV cells integrating those films are production-worthy and may be commercialized.

Figure 3:
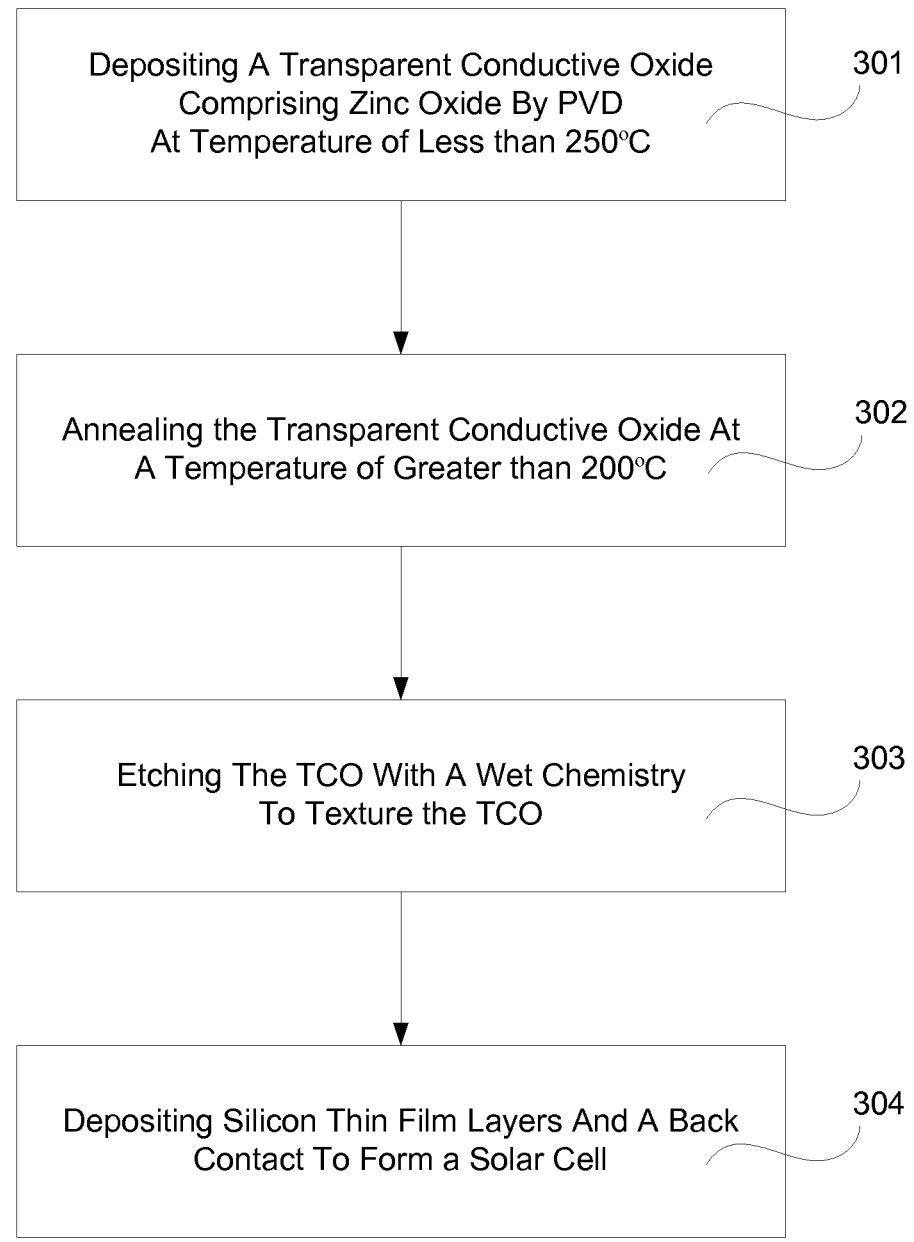
FIG. 3 is a flowchart showing a method of processing a transparent conductive oxide film and completing a solar cell according to an embodiment of the current invention.

The flowchart of FIG. 3 illustrates an improved TCO deposition and texturing process determined using the dry and wet workflow outlined above through the flowcharts in FIGS. 1 and 2. This improved TCO deposition and texturing process uses low temperatures that are advantageous to processing at the production level where large substrates on the order of approximately 2 meters×3 meters may be used. In FIG. 4A, a glass substrate 410 is provided. The zinc oxide TCO 415 may be deposited on any type of glass substrate 410 that may be used for the production of thin film photovoltaic solar cells. For example, the glass substrate may be borosilicate glass (BSG) or low iron soda lime glass and similar engineered glasses. In this particular embodiment, at block 301 of FIG. 3, and as illustrated by FIG. 4B, a TCO 415 formed of zinc oxide (ZnO) may be deposited by physical vapor deposition at a temperature of less than 100° C., and more particularly at a temperature of approximately 20° C. (room temperature). A TCO deposition process using a low temperature may have significant advantages when the processing of the TFPV cells integrating that particular TCO is scaled up to production level. One such advantage may be the prevention of breaking the glass substrates due to high temperature processing. Another such advantage may be that low temperature PVD chambers may be used. The zinc oxide TCO may be doped with any doping element that can make the zinc oxide TCO an n-type conductor such as boron (B), aluminum (Al), gallium (Ga), indium (In), or fluorine (F). The dopants may be present in the TCO film in a range of approximately 0.1 atomic % to 5.0 atomic %, as long as the TCO film remains ZnO dominated. The PVD process can be done by either pure Ar sputtering from an oxide target containing the dopant elements or by reactive sputtering from separate metal targets (Zn and the dopants) or alloying targets containing both Zn and the dopant. The oxygen environment within the deposition chamber is controlled to minimize the amount of oxygen. Controlling the amount of oxygen may be valuable in controlling the electrical properties of the TCO film. The process pressure may be approximately 20 mT or less, or more particularly 5 mT or less. The process chamber pressure is a parameter that can be adjusted to influence the electrical qualities of the TCO film. In an embodiment, an increase in process chamber pressure during deposition may improve electrical qualities of the TCO film. The zinc oxide TCO film may be deposited to a thickness in the approximate range of 0.4 µm-1.5 µm, or more particular approximate range of 0.6 µm-1.0 µm. The as-deposited zinc oxide TCO film has a crystalline composition.

At block 302 the zinc oxide TCO is annealed at a temperature of greater than 200° C., but no more than 400° C. The oxygen content within the annealing chamber is controlled to maintain good electrical qualities of the TCO film, such as conductivity. In one embodiment, the oxygen within the annealing chamber is minimized as much as possible by first flushing the atmosphere with an inert gas such as nitrogen ($N_2$) and then annealing under a reducing environment. The oxygen may also be controlled by flushing the chamber with both nitrogen and oxygen prior to the anneal or by striking a hydrogen ($H_2$) plasma within the chamber to bind up the oxygen as water, thereby removing any reactive $O_2$, or other known methods. The time duration of the anneal may be in the approximate range of 1 minute and 30 minutes, and more particularly in the approximate range of 5 minutes and 15 minutes. The annealing time was improved based on the time sufficient to provide a zinc oxide TCO with good electrical performance as measured by sheet resistance.

Figure 5B:
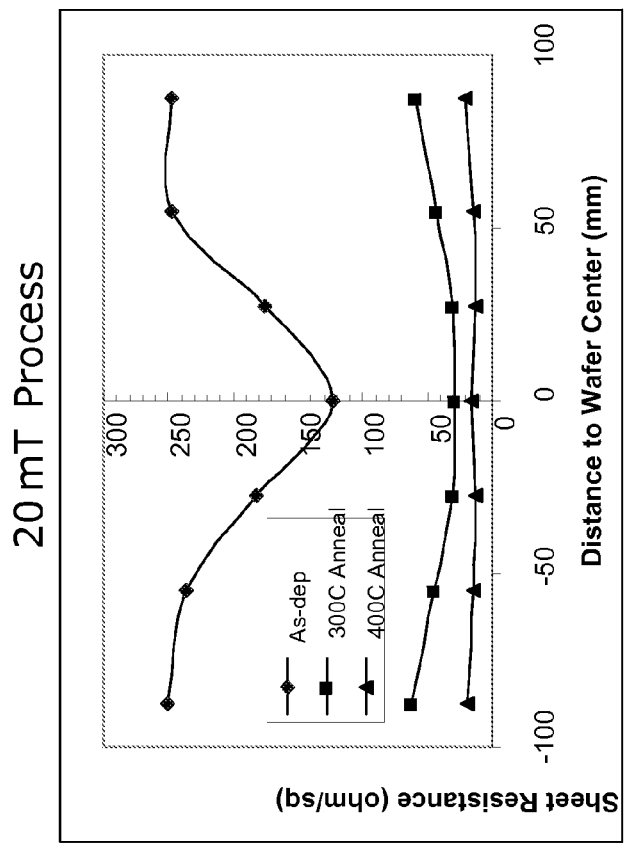
FIGS. 5A and 5B are graphs showing data collected on transparent conductive oxide films deposited by different methods.
Figure 5A:
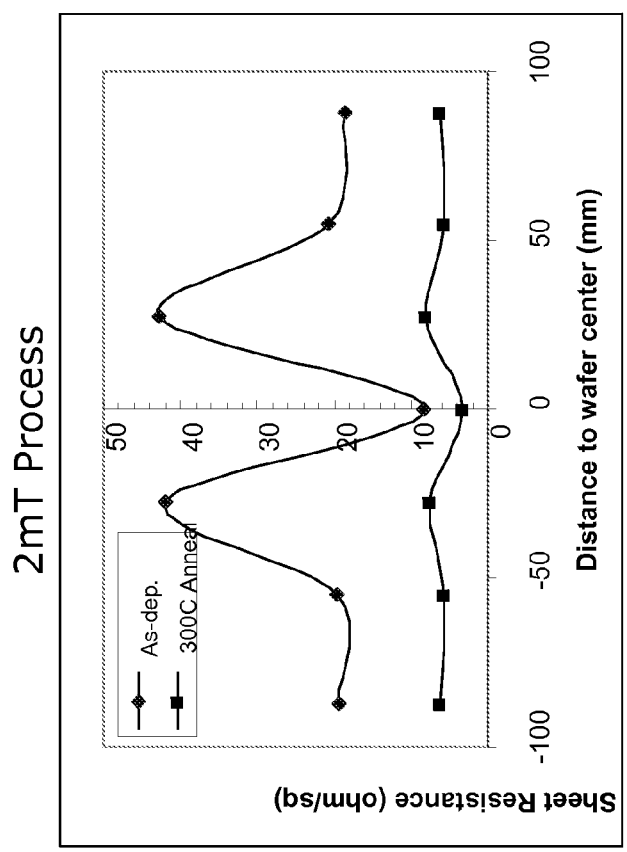

FIG. 5A and FIG. 5B show electrical data of room temperature deposited zinc oxide TCO films that have been annealed at different temperatures. FIG. 5A and FIG. 5B are graphs plotting the measured sheet resistance (ohm/cm$^2$) vs. the position of the Rs measurement on the wafer (distance to wafer center (mm)). These data suggest that the thermal anneal improves the electrical performance and the uniformity of the electrical performance of the ZnO TCO films. In both FIG. 5A and FIG. 5B the data were collected on approximately 0.1 µm thick ZnO films deposited by PVD using Ar sputtering on a Al-doped ZnO target and at room temperature (approximately 20° C.). FIG. 5A compares data collected on zinc oxide TCO films deposited at a lower pressure (2 mT) to the FIG. 5B data collected on zinc oxide TCO films deposited at a higher pressure (20 mT.) These data also suggest that a higher pressure (mT) within the chamber improves electrical performance, but that the thermal anneal over-riding factor in the electrical performance and uniformity of the films.

In this embodiment, at block 303, the ZnO TCO 415 is textured by a wet etch after the annealing to provide a textured ZnO TCO 420. The wet etch solution may be any type of acid or base that can etch a zinc oxide TCO. Examples of acidic etchants include sulfuric acid, hydrochloric acid, nitric acid, and phosphoric acid. The wet etch solution may also be an aqueous solution of an organic acid such as acetic acid, oxalic acid, and carboxylic acid. In one particular embodiment, the organic acid is selected from the hydroxyl carboxylic acid family which includes glycolic acid and citric acid. In alternative embodiments, the etching formulation may include combinations of organic acids and inorganic acids. The active etchant component may also be selected from a basic compound such as KOH, TMAH, and ammonium hydroxide. Similar to the acidic etching formulations the basic etching formulations may be varied using different bases or combinations of bases. The wet etch solution may be applied to the zinc oxide TCO by methods such as immersion, spraying, or dispensation. The time and temperature at which the wet etch solution may be applied to the substrate may depend on the particular wet etch chemistry selected or by manufacturing requirements.

It has been experimentally determined that the post-deposition anneal described in this method improves the texturing process. The experimental data includes physical data (atomic force microscopy (AFM)) showing the texture itself and electrical data (sheet resistance (Rs)) showing improved electrical qualities of the textured zinc oxide TCO film. Sheet resistance (Rs) data of post-wet etch zinc oxide TCO films comparing films having a high temperature post-deposition anneal vs. a low temperature post-deposition anneal.

This two-step process of PVD+ anneal could replace the single step process of forming a TCO film at a high temperature by physical vapor deposition. Although this two-step process would require two tools, a PVD chamber and an annealing chamber, instead of only one tool (high temperature PVD chamber) the two tools are simpler and less expensive than a single high temperature PVD tool. The tools for solar panels are very large and maintaining a constant and uniform high temperature in a large space is difficult and requires a complex PVD deposition tool. Not only would the capital investments costs be lower, but the maintenance costs would be lower.

At block 304 the TFPV solar cell is completed as described above in relation to FIGS. 4D and 4E. In FIG. 4D the silicon 430 is deposited to serve as the optical conversion layer where light is transformed into electrical energy. The silicon layer 430 may deposit conformally over the textured TCO film 420 and thus the texturing will be translated to the silicon layer 430 as illustrated in FIG. 4D. In FIG. 4E, the deposition of a back contact electrode 440 completes the basic TFPV solar cell 400. The back contact electrode 440 may be any conductive material.

Although the foregoing examples have been described in some detail for purposes of clarity of understanding, the invention is not limited to the details provided. There are many alternative ways of implementing the invention. The disclosed examples are illustrative and not restrictive.

What is claimed:
1. A combinatorial method, comprising:
depositing a transparent conductive oxide (TCO) film by physical vapor deposition, wherein depositing the TCO comprises a site-isolated deposition to form site-isolated regions on a single substrate through the physical vapor deposition, each site isolated region having a uniform composition of zinc oxide;
annealing the TCO film;
forming a molecular mask on the TCO film, the molecular mask allowing for differential texturing, wherein forming the molecular mask comprises applying an etching formulation to the surface of the TCO film; and etching the TCO film to provide a textured surface that scatters light incident upon the textured surface, wherein at least one of the depositing, the annealing, or the etching is performed combinatorially.

2. The combinatorial method of claim 1, wherein the annealing is performed after the etching.

3. The method of claim 1, wherein the etching is a wet etch.

4. The combinatorial method of claim 1, wherein the etching is achieved with an acidic wet chemistry.

5. The combinatorial method of claim 4, wherein the acidic wet chemistry is one of sulfuric acid, hydrochloric acid, nitric acid, phosphoric acid, acetic acid, oxalic acid, or carboxylic acid.

6. The combinatorial method of claim 1, further comprising:
depositing an optical conversion layer configured to transform incident light into electrical energy over the textured surface of the TCO film; and
depositing a conductive material over the optical conversion layer.

7. The combinatorial method of claim 6, wherein the site-isolated deposition comprises placing a physical mask on the substrate and depositing the TCO film over the physical mask.

8. The combinatorial method of claim 7, further comprising varying the depositing between the site-isolated regions.

9. The combinatorial method of claim 8, wherein varying the depositing between the site-isolated regions comprises varying a deposition temperature.

10. The combinatorial method of claim 1, wherein the etching is performed in a site-isolated manner to form site-isolated regions.

11. The combinatorial method of claim 10, further comprising varying the etching between site-isolated regions.

12. The combinatorial method of claim 11, wherein varying the etching between site-isolated regions comprises varying the etching chemistries.

13. The combinatorial method of claim 1, wherein annealing in a combinatorial manner comprises varying the annealing temperature.

14. The combinatorial method of claim 1, wherein annealing in a combinatorial manner comprises varying the gas ambient within an annealing chamber during the annealing.

15. A method of forming a solar substrate, comprising:
depositing a transparent conductive oxide (TCO) layer on a substrate by physical vapor deposition (PVD) at a temperature of less than 250° C.;
annealing the TCO at a temperature of greater than 200° C.;
forming a molecular mask on the TCO the molecular mask allowing for differential texturing, wherein forming the molecular mask comprises applying an etching formulation to the surface of the TCO; and
etching the TCO to provide a textured surface that scatters light incident upon the textured surface;
depositing an optical conversion layer configured to transform incident light into electrical energy over the textured surface of the TCO; and
depositing a conductive material over the optical conversion layer.

16. The method of claim 15, further comprising etching the TCO with a wet chemistry to texture a surface of the TCO in an irregular pattern.

17. The method of claim 15, wherein depositing the transparent conductive oxide (TCO) on a substrate by physical vapor deposition (PVD) is done at room temperature.

18. The method of claim 15, wherein annealing the TCO comprises annealing the TCO at a temperature in the approximate range of 250° C.-350° C.

19. The method of claim 15, wherein annealing the TCO comprises one of conventional thermal heating or rapid thermal annealing (RTA).

20. The method of claim 15, wherein the etching is performed with a wet etchant.

* * * * *